(12) United States Patent
Kim et al.

(10) Patent No.: US 12,412,872 B2
(45) Date of Patent: Sep. 9, 2025

(54) DISPLAY DEVICE AND MANUFACTURING METHOD OF DISPLAY DEVICE WITH THE PLURALITY OF LIGHT EMITTING NANORODS

(71) Applicant: LG Display Co., Ltd., Seoul (KR)

(72) Inventors: Il-Soo Kim, Goyang-si (KR); Taeil Jung, Paju-si (KR); Seongkyong Park, Gimpo-si (KR)

(73) Assignee: LG DISPLAY CO., LTD., Seoul (KR)

(*) Notice: Subject to any disclaimer, the term of this patent is extended or adjusted under 35 U.S.C. 154(b) by 669 days.

(21) Appl. No.: 17/377,108

(22) Filed: Jul. 15, 2021

(65) Prior Publication Data

US 2022/0020906 A1    Jan. 20, 2022

(30) Foreign Application Priority Data

Jul. 15, 2020    (KR) .................. 10-2020-0087747

(51) Int. Cl.
*H01L 25/075*    (2006.01)
*H10H 20/01*    (2025.01)
(Continued)

(52) U.S. Cl.
CPC ......... *H01L 25/0753* (2013.01); *H10H 20/01* (2025.01); *H10H 20/831* (2025.01);
(Continued)

(58) Field of Classification Search
CPC ..... H01L 33/62; H01L 27/156; H01L 33/005; H01L 33/38; H01L 2933/0016;
(Continued)

(56) References Cited

U.S. PATENT DOCUMENTS

2017/0357344 A1* 12/2017 Hong .................. G06F 3/0447
2018/0012876 A1   1/2018 Kim et al.
(Continued)

FOREIGN PATENT DOCUMENTS

CN    108598251 A    9/2018
CN    110400819 A    11/2019
(Continued)

*Primary Examiner* — Norman D Richards
*Assistant Examiner* — Sean Ayers Winters
(74) *Attorney, Agent, or Firm* — Birch, Stewart, Kolasch & Birch, LLP

(57) ABSTRACT

According to an aspect of the present disclosure, a display device having a plurality of pixels each including a plurality of sub-pixels, includes a first substrate; a plurality of first pads disposed on the first substrate in the plurality of sub-pixels; a common pad disposed on the first substrate and shared by the plurality of sub-pixels; a second substrate disposed to face the first substrate; a plurality of first electrodes disposed on the second substrate and connected to the plurality of first pads; a second electrode disposed on the second substrate and connected to the common pad; and a plurality of light emitting nanorods having one ends and the other ends respectively connected to the plurality of first electrodes and the second electrode. Therefore, self-aligning of the light emitting nanorods can be easily achieved.

20 Claims, 13 Drawing Sheets

(51) Int. Cl.
    *H10H 20/831*    (2025.01)
    *H10H 20/857*    (2025.01)
    *H10H 29/14*     (2025.01)
    *H10K 59/80*     (2023.01)

(52) U.S. Cl.
    CPC ........ *H10H 20/857* (2025.01); *H10H 29/142* (2025.01); *H10K 59/805* (2023.02); *H10H 20/032* (2025.01); *H10H 20/0364* (2025.01)

(58) Field of Classification Search
    CPC ........ H01L 2933/0066; H01L 25/0753; H10K 59/805; H10H 29/142; H10H 20/01; H10H 20/831; H10H 20/857; H10H 20/0364; H10H 20/032
    See application file for complete search history.

(56) References Cited

U.S. PATENT DOCUMENTS

| | | | |
|---|---|---|---|
| 2018/0090061 A1* | 3/2018 | Kim | H10K 50/805 |
| 2021/0288033 A1* | 9/2021 | Lim | H01L 33/08 |

FOREIGN PATENT DOCUMENTS

| | | | | |
|---|---|---|---|---|
| EP | 3 787 027 A1 | | 3/2021 | |
| KR | 10-2013-0127389 A | | 11/2013 | |
| KR | 10-2017-0010132 A | | 1/2017 | |
| KR | 10-2018-0007025 A | | 1/2018 | |
| KR | 10-2019-0124359 A | | 11/2019 | |
| TW | 201946270 A | | 12/2019 | |
| TW | 202013025 A | | 4/2020 | |
| WO | WO-2020013386 A1 * | | 1/2020 | H01L 25/0753 |

\* cited by examiner

DISPLAY DEVICE AND MANUFACTURING METHOD OF DISPLAY DEVICE WITH THE PLURALITY OF LIGHT EMITTING NANORODS

CROSS-REFERENCE TO RELATED APPLICATIONS

This application claims the benefit of and priority to Korean Patent Application No. 10-2020-0087747 filed on Jul. 15, 2020 in the Republic of Korea, the entire contents of which are hereby expressly incorporated by reference into the present application.

BACKGROUND

Technical Field

The present disclosure relates to a display device, and more particularly, to a display device capable of easily self-aligning light emitting nanorods and a method of manufacturing the display device.

Discussion of the Related Art

Recently, as our society advances toward an information-oriented society, the field of display devices for visually expressing an electrical information signal has rapidly advanced. Various display devices having excellent performance in terms of thinness, lightness, and low power consumption, are being continually developed correspondingly.

Specifically, flat panel display devices such as a liquid crystal display device using a light emitting diode (LED) as a light source and an organic light emitting diode (OLED) display device using a self-emission type OLED, are attracting attention as the next-generation display devices due to their small thicknesses and low power consumption.

The inventors of the present disclosure have recognized that in the case of a display device using light emitting nanorods as light emitting elements among display devices using LEDs as described above, a process time increases and a decrease in yield can be caused. Specifically, since red light emitting nanorods, green light emitting nanorods, and blue light emitting nanorods are individually grown and transferred to a display panel individually, the process time can increase, leading to a decrease in yield. In addition, since the light emitting nanorods are individually transferred, there can be a limit to a reduction in the size of the light emitting nanorods.

SUMMARY OF THE INVENTION

Accordingly, the inventors of the present disclosure have invented a display device and a method of manufacturing the display device, capable of reducing a process time and costs by self-aligning light emitting nanorods in a manufacturing process.

An object of the present disclosure is to provide a display device capable of self-aligning light emitting nanorods through first and second electrodes electrically respectively connected to one ends and the other ends of the light emitting nanorods and a method of manufacturing the display device.

Another object of the present disclosure is to provide a display device and a method of manufacturing the display device, in which the self-alignment can be more easily achieved by forming protrusions on the first electrode and/or the second electrode connected to the light emitting nanorods.

Objects of the present disclosure are not limited to the above-mentioned objects, and other objects, which are not mentioned above, can be clearly understood by those skilled in the art from the following descriptions.

In order to solve the above problems, according to an aspect of the present disclosure, a display device having a plurality of pixels each of which includes a plurality of sub-pixels, includes a first substrate; a plurality of first pads disposed on the first substrate in the plurality of sub-pixels; a common pad disposed on the first substrate and shared by the plurality of sub-pixels; a second substrate disposed to face the first substrate; a plurality of first electrodes disposed on the second substrate and connected to the plurality of first pads; a second electrode disposed on the second substrate and connected to the common pad; and a plurality of light emitting nanorods having one ends and the other ends respectively connected to the plurality of first electrodes and the second electrode. The plurality of first electrodes and/or the second electrode includes a plurality of protrusions connected to the plurality of light emitting nanorods.

According to another aspect of the present disclosure, a display device having a plurality of pixels each of which includes a plurality of sub-pixels, includes a first substrate and a second substrate facing each other; a plurality of first pads disposed on the first substrate in the plurality of sub-pixels; a common pad disposed on the first substrate and shared by the plurality of sub-pixels; a plurality of first electrodes disposed on the second substrate in the plurality of sub-pixels; a second electrode disposed on the second substrate and shared by the plurality of sub-pixels; a plurality of light emitting nanorods disposed on the second substrate in the plurality of sub-pixels and in contact with the plurality of first electrodes and the second electrode; and adhesive patterns connecting the plurality of first pads and the plurality of first electrodes and connecting the common pad and the second electrode. The plurality of first electrodes and/or the second electrode includes a plurality of protrusions connected to the plurality of light emitting nanorods.

According to yet another aspect of the present disclosure, a method of manufacturing a display device having a plurality of pixels each of which includes a plurality of sub-pixels, includes preparing a first substrate on which a plurality of first pads disposed in the plurality of sub-pixels and a common pad shared by the plurality of sub-pixels are disposed; forming a first electrode layer and a second electrode layer spaced apart from each other on a second substrate; self-aligning a plurality of light emitting nanorods by applying a direct current to the first electrode layer and the second electrode layer; separating the first electrode layer and the second electrode layer into a plurality of first electrodes and a second electrode, respectively, corresponding to the plurality of sub-pixels; and bonding the first substrate and the second substrate by connecting the plurality of first pads and the plurality of first electrodes and connecting the common pad and the second electrode. The plurality of light emitting nanorods are connected to a plurality of protrusions of the first electrode layer and/or the second electrode layer and are self-aligned.

Other detailed matters of the exemplary embodiments are included in the detailed description and the drawings.

According to the present disclosure, light emitting nanorods are self-aligned by applying a current to a first electrode and a second electrode of a substrate, so that a process can be simplified and costs can be reduced.

According to the present disclosure, alignment accuracy of the light emitting nanorods can be improved by concentrating a current on protrusions formed on the first electrode and/or the second electrode.

The effects according to the present disclosure are not limited to the contents exemplified above, and more various effects are included in the present specification.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
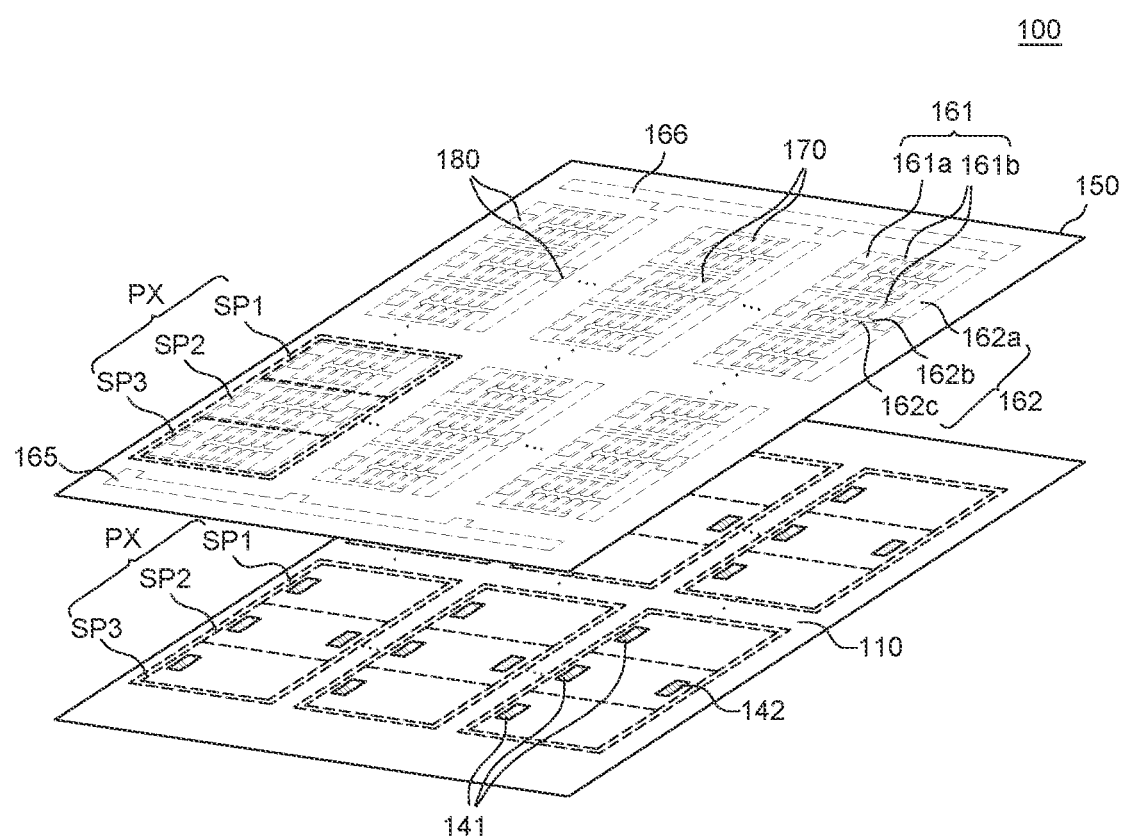
FIG. 1 is an exploded perspective view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings. All the components of each display device according to all embodiments of the present disclosure are operatively coupled and configured.

Figure 2:
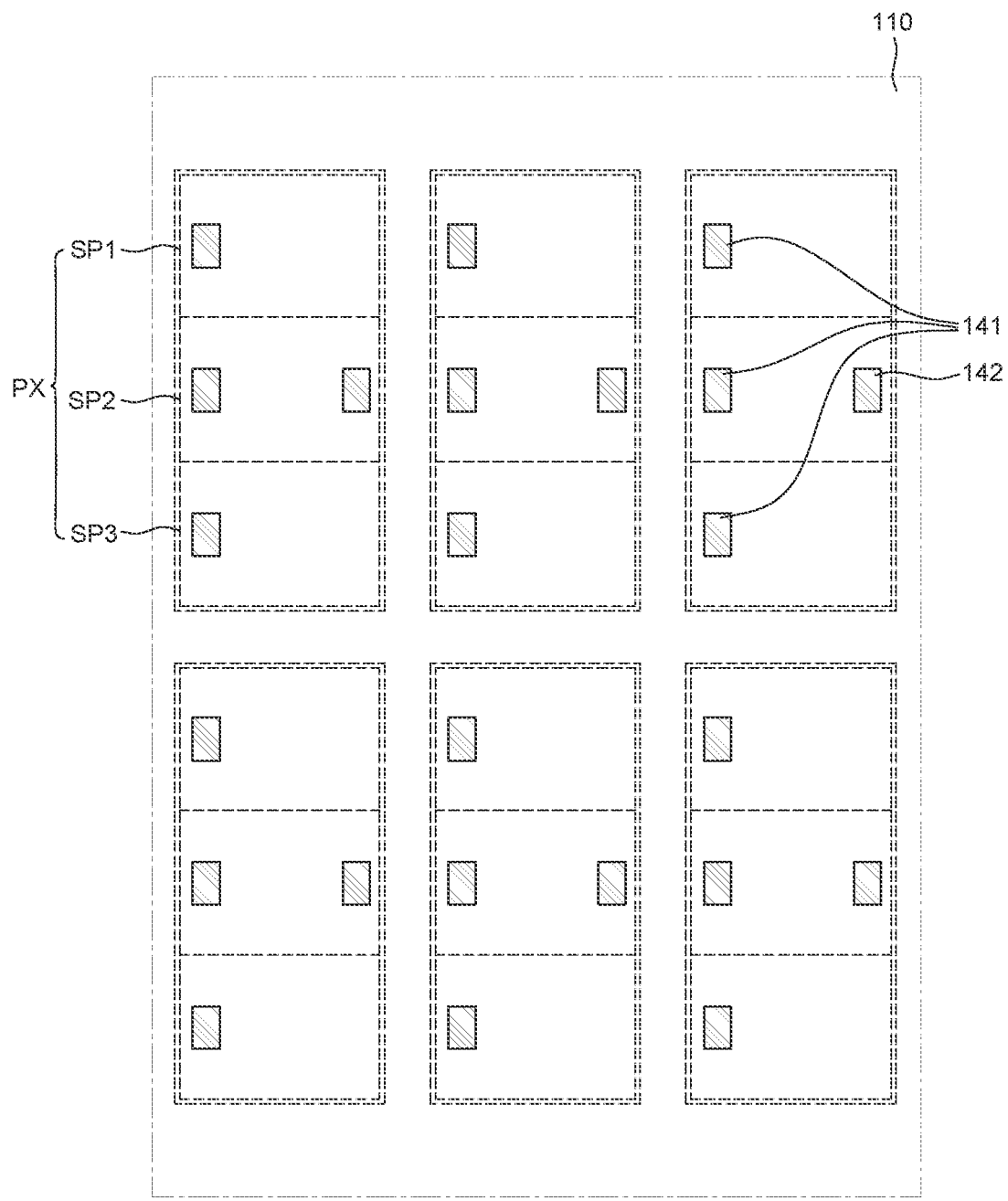
FIG. 2 is an enlarged plan view of a first substrate of the display device according to an exemplary embodiment of the present disclosure.
Figure 3A:
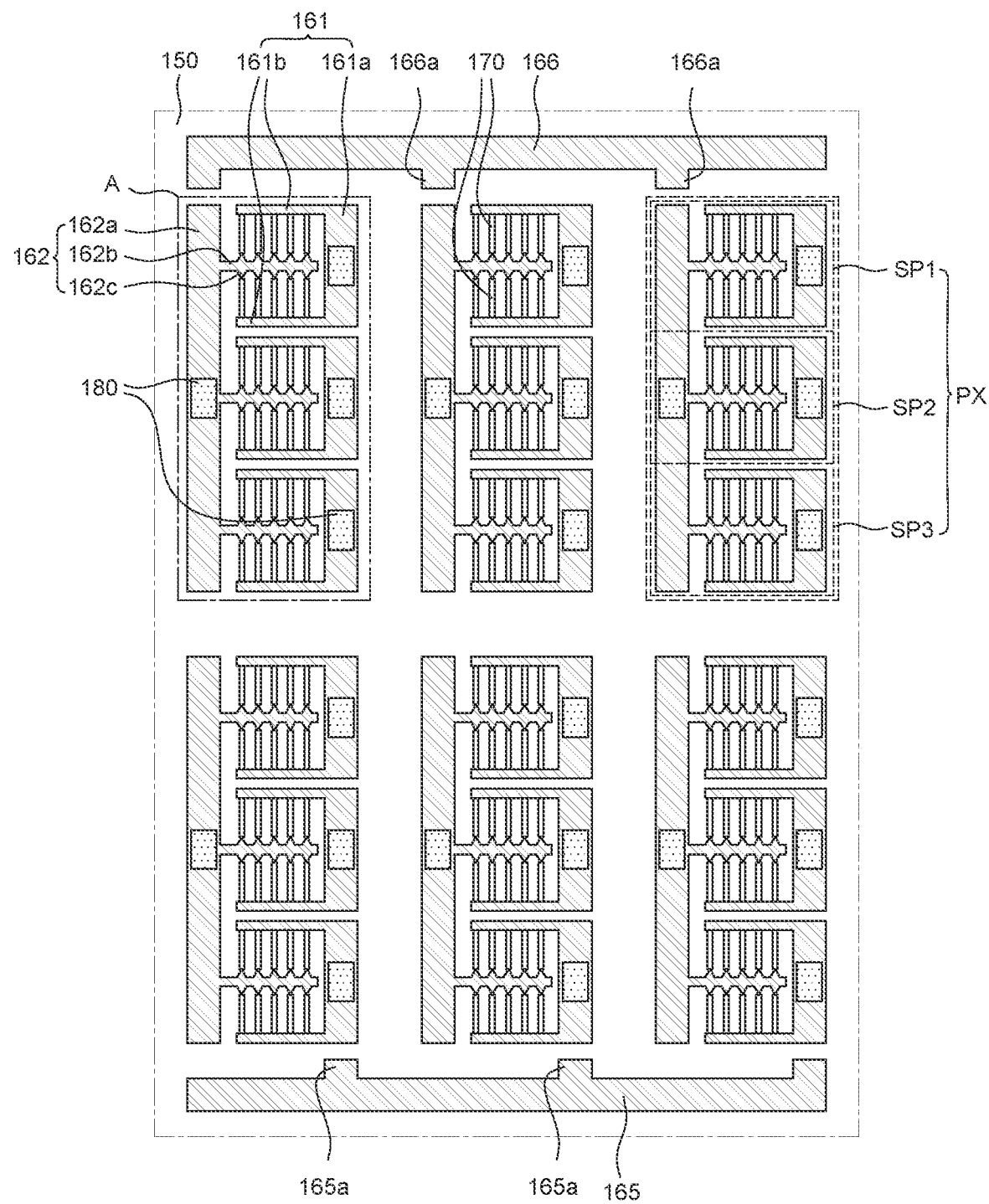
FIG. 3A is an enlarged plan view of a second substrate of the display device according to an exemplary embodiment of the present disclosure.
Figure 3B:
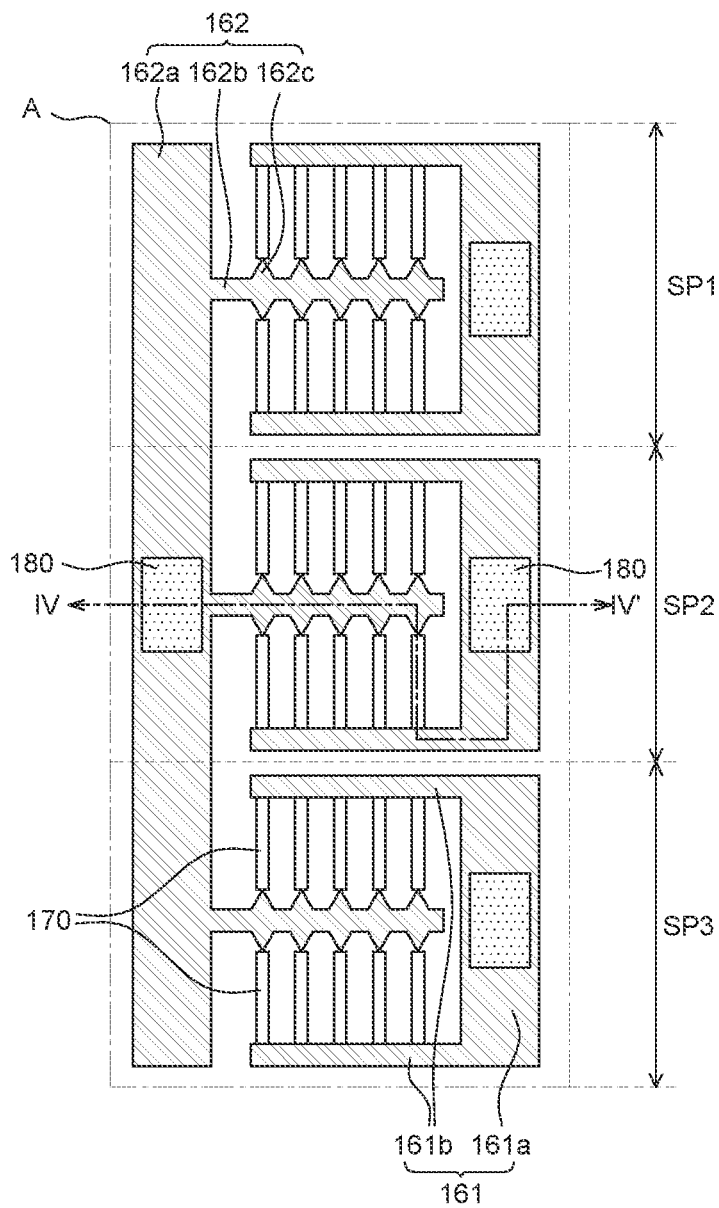
FIG. 3B is an enlarged view of region A of FIG. 3A.

FIG. 1 is an exploded perspective view of a display device according to an exemplary embodiment of the present disclosure. FIG. 2 is an enlarged plan view of a first substrate of the display device according to an exemplary embodiment of the present disclosure. FIG. 3A is an enlarged plan view of a second substrate of the display device according to an exemplary embodiment of the present disclosure. FIG. 3B is an enlarged view of region A of FIG. 3A.

In FIG. 1 to FIG. 3B, for convenience of explanation, in a display device 100, a first substrate 110, first pads 141, common pads 142, a second substrate 150, first electrodes 161, second electrodes 162, first and second dummy electrodes 165 and 166, light emitting nanorods 170, and adhesive patterns 180 among various components of the display device 100, are shown. FIG. 3A can be a view of the second substrate 150 shown in FIG. 1 as viewed from the bottom.

Hereinafter, with reference to FIG. 1 to FIG. 3B, arrangement structures of a plurality of first pads 141, a plurality of common pads 142, a plurality of first electrodes 161, a plurality of second electrodes 162, first and second dummy electrodes 165 and 166, and light emitting nanorods 170 on a plane will be mainly described.

Referring to FIG. 1 to FIG. 3B, the display device 100 according to an exemplary embodiment of the present disclosure includes the first substrate 110 and the second substrate 150. The first substrate 110 and the second substrate 150 can face each other and can be electrically connected to each other by the adhesive patterns 180.

The display device has a plurality of pixels PX each of which includes a plurality of sub-pixels. The first substrate 110 and the second substrate 150 each carry various components constituting the plurality of pixels PX. Each of the plurality of pixels PX can include a first sub-pixel SP1, a second sub-pixel SP2, and a third sub-pixel SP3 that emit light of different wavelengths. The plurality of pixels PX are minimum units constituting a screen, and each of the plurality of sub-pixels SP1, SP2, and SP3 can include the light emitting nanorods 170 and a pixel circuit for driving the light emitting nanorods 170. The first sub-pixel SP1, the second sub-pixel SP2, and the third sub-pixel SP3 can be a blue sub-pixel, a green sub-pixel, and a red sub-pixel, respectively, but are not limited thereto, and any other number of sub-pixels can be provided in each pixel PX.

The plurality of first pads 141 and the plurality of common pads 142 are disposed on the first substrate 110. The plurality of first pads 141 and the plurality of common pads 142 can be spaced apart from each other and disposed on a planarization layer 115 to be described later above the first substrate 110.

The plurality of first pads 141 can be disposed to correspond to the plurality of respective sub-pixels SP1, SP2, and SP3. The plurality of first pads 141 can be disposed on one sides of the plurality of sub-pixels SP1, SP2, and SP3, i.e., one side of the plurality of pixels PX. The plurality of first pads 141 can be electrically connected to transistors 120 to be described later disposed in the plurality of sub-pixels SP1, SP2, and SP3. Also, the plurality of first pads 141 can be electrically connected to the plurality of first electrodes 161 by the adhesive patterns 180.

The plurality of common pads 142 can be disposed to correspond to each of the plurality of pixels PX. Specifically, the first sub-pixel SP1, the second sub-pixel SP2, and the third sub-pixel SP3 of one pixel PX can share one common pad 142 in common. The common pad 142 can be disposed on the other side of the pixel PX. In the present disclosure, although it is illustrated that the common pad 142 is disposed on the other side of the second sub-pixel SP2, the present disclosure is not limited thereto. The common pad 142 can be electrically connected to a common electrode 130 to be described later connected to the first sub-pixel SP1, the second sub-pixel SP2, and the third sub-pixel SP3 in common. Also, the common pad 142 can be electrically connected to the second electrode 162 by the adhesive pattern 180.

The plurality of first electrodes 161, the plurality of second electrodes 162, the first and second dummy electrodes 165 and 166, and a plurality of the light emitting nanorods 170 are disposed on the second substrate 150. The plurality of first electrodes 161, the plurality of second electrodes 162, and the first and second dummy electrodes 165 and 166 can be disposed to be spaced apart from each other on the same plane.

The plurality of first electrodes 161 can be disposed to correspond to the plurality of respective sub-pixels SP1, SP2, and SP3 on the second substrate 150. The plurality of first electrodes 161 can be disposed to overlap the plurality of first pads 141. The plurality of first electrodes 161 can include first portions 161a overlapping the plurality of first pads 141 and pairs of second portions 161b extending from one ends and the other ends of the first portions 161a or from one sides and the other sides of the first portions 161a. The pair of second portions 161b can be disposed to be parallel to each other.

The plurality of second electrodes 162 can be disposed to correspond to each of the plurality of pixels PX on the second substrate 150. Specifically, the first sub-pixel SP1, the second sub-pixel SP2, and the third sub-pixel SP3 of one pixel PX can share one second electrode 162 in common. The second electrodes 162 can be disposed to be opposite to the plurality of first electrodes 161 in the pixels PX. Also, the plurality of second electrodes 162 can be disposed to overlap the plurality of common pads 142.

The plurality of second electrodes 162 can include line electrodes 162a overlapping the plurality of common pads 142 and a plurality of branch electrodes 162b extending from the line electrodes 162a toward the plurality of first electrodes 161. The line electrode 162a can be parallel to the first portions 161a of the first electrodes 161 and can be disposed in common in the first sub-pixel SP1, the second sub-pixel SP2, and the third sub-pixel SP3. The plurality of branch electrodes 162b can be surrounded by the plurality of first electrodes 161. The branch electrode 162b can extend to be parallel to the pair of second portions 161b in each of the plurality of sub-pixels SP1, SP2, and SP3. In the plurality of sub-pixels SP1, SP2, and SP3, the branch electrode 162b can be disposed between the pair of second portions 161b.

The plurality of second electrodes 162 can further include a plurality of second protrusions 162c protruding from the branch electrodes 162b toward the pairs of second portions 161b. The plurality of second protrusions 162c can be formed to be narrower in width from the branch electrode 162b toward the second portion 161b. In addition, ends of the plurality of second protrusions 162c can have a sharp shape. For example, the plurality of second protrusions 162c can have a triangular shape, but is not limited thereto.

The plurality of light emitting nanorods 170 can be connected to the plurality of second protrusions 162c. The plurality of light emitting nanorods 170 can be easily aligned by the plurality of second protrusions 162c. Specifically, when the plurality of light emitting nanorods 170 are self-aligned, a current is concentrated on the plurality of second protrusions 162c, so that the plurality of light emitting nanorods 170 can be easily aligned. This will be described later with reference to FIG. 6A to FIG. 6C.

Meanwhile, although FIG. 1 to FIG. 3B illustrate that the plurality of second protrusions 162c are formed on the second electrode 162, a plurality of first protrusions can be formed on the first electrode 161. In this case, the plurality of first protrusions can protrude from the pair of second portions 161b toward the branch electrodes 162b. Also, although FIG. 1 to FIG. 3B illustrate that ten second protrusions 162c are disposed in one sub-pixel SP1, SP2, or SP3, the present disclosure is not limited thereto.

The first and second dummy electrodes 165 and 166 are disposed outside the plurality of pixels PX to be adjacent to portions of the plurality of pixels PX. The first and second dummy electrodes 165 and 166 can be connected to the plurality of first electrodes 161 and the plurality of second electrodes 162 before the light emitting nanorods 170 are aligned. The first and second dummy electrodes 165 and 166 can be separated from the plurality of first electrodes 161 and the plurality of second electrodes 162 after the light emitting nanorods 170 are aligned. The first dummy electrode 165 can include first dummy protrusions 165a that are separated from the first electrodes 161, and the second dummy electrode 166 can include second dummy protrusions 166a that are separated from the second electrodes 162. The first dummy protrusions 165a can be disposed on the same lines as the first portions 161a of the plurality of first electrodes 161. The second dummy protrusions 166a can be disposed on the same lines as the line electrodes 162a of the plurality of second electrodes 162. The dummy electrodes 165 and 166 will be described later with reference to FIG. 6A to FIG. 6C.

Meanwhile, although it is illustrated that the first dummy electrode 165 and the second dummy electrode 166 are disposed on an upper side and a lower side of the second substrate 150, respectively, the present disclosure is not limited thereto. For example, the number and arrangement of the first and second dummy electrodes 165 and 166 can be variously changed according to the number and arrangement of pixels PX connected to the first and second dummy electrodes 165 and 166 during a manufacturing process.

The plurality of light emitting nanorods 170 are disposed between the first electrode 161 and the second electrode 162. One ends of the plurality of light emitting nanorods 170 can be electrically connected to the first electrode 161, and the other ends of the plurality of light emitting nanorods 170 can be electrically connected to the second electrode 162. Specifically, one ends of the plurality of light emitting nanorods 170 can be connected to the second portion 161b, and the other ends of the plurality of light emitting nanorods 170 can be connected to the second protrusions 162c of the branch electrode 162b.

The plurality of light emitting nanorods 170 can be connected to the first electrode 161 and the second electrode 162 to emit light having a wavelength corresponding to each of the sub-pixels SP1, SP2, and SP3. For example, the plurality of light emitting nanorods 170 disposed in the first sub-pixel SP1 can emit blue light, the plurality of light emitting nanorods 170 disposed in the second sub-pixel SP2 can emit green light, and the plurality of light emitting nanorods 170 disposed in the third sub-pixel SP3 can emit red light, but the present disclosure is not limited thereto.

The adhesive patterns 180 are disposed on the first portions 161a of the first electrodes 161 and the line electrodes 162a of the second electrodes 162. The adhesive patterns 180 are disposed to overlap the plurality of first pads 141 and the plurality of common pads 142. The adhesive patterns 180 can electrically connect the first pads 141 of the first substrate 110 and the first electrodes 161 of the second substrate 150. In addition, the adhesive patterns 180 can electrically connect the common pads 142 of the first substrate 110 and the second electrodes 162 of the second substrate 150.

Hereinafter, one sub-pixel SP2 of the display device 100 will be described in more detail with reference to FIG. 4. The cross-sectional view illustrated in FIG. 4 can be a cross-sectional view of the second sub-pixel SP2. However, a structure of FIG. 4 except for the common pad 142 can be equally applied to the first sub-pixel SP1 and the third sub-pixel SP3.

Figure 4:
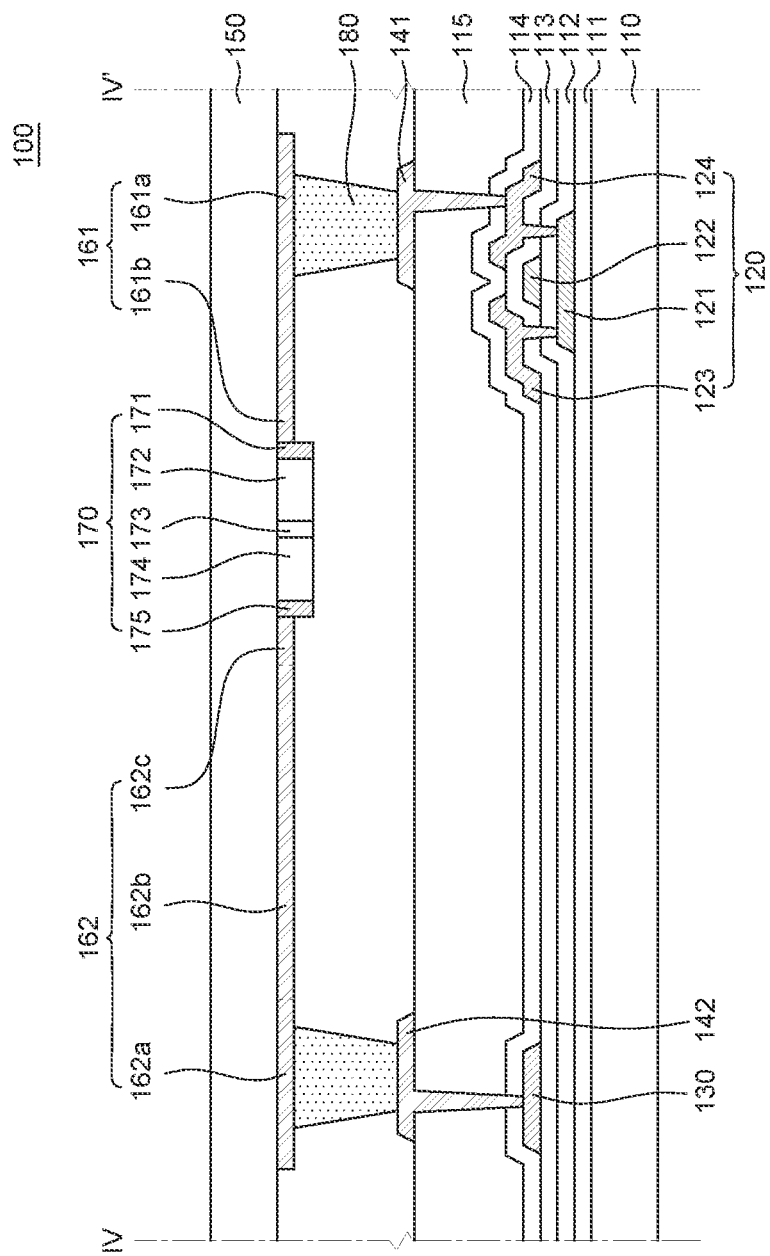
FIG. 4 is a cross-sectional view of the display device taken along line IV-IV' of FIG. 3B.

Particularly, FIG. 4 is a cross-sectional view of the display device taken along line IV-IV' of FIG. 3B.

Referring to FIG. 4, the first substrate 110 is a support member for supporting other components of the display device 100, and can be formed of an insulating material. For example, the first substrate 110 can be formed of glass or resin. In addition, the first substrate 110 can be formed to include a polymer or plastic such as polyimide (PI), or can be formed of a material having flexibility.

A buffer layer 111 is disposed on the first substrate 110. The buffer layer 111 can reduce penetration of moisture or impurities through the first substrate 110. The buffer layer 111 can be composed of, for example, a single layer or multilayers of silicon oxide (SiOx) or silicon nitride (SiNx), but is not limited thereto. However, the buffer layer 111 can be omitted depending on a type of the first substrate 110 or a type of the transistor 120, but is not limited thereto.

The transistor 120 is disposed on the buffer layer 111. The transistor 120 includes an active layer 121, a gate electrode 122, a source electrode 123, and a drain electrode 124.

The active layer 121 is disposed on the buffer layer 111. The active layer 121 can be formed of a semiconductor material such as an oxide semiconductor, amorphous silicon, or polysilicon, but is not limited thereto. For example, when the active layer 121 is formed of an oxide semiconductor, the active layer 121 includes a channel region, a source region, and a drain region, and the source region and the drain region can be conductive regions, but are not limited thereto.

A gate insulating layer 112 is disposed on the active layer 121. The gate insulating layer 112 is an insulating layer for insulating the active layer 121 and the gate electrode 122 and can be composed of a single layer or multilayers of silicon oxide (SiOx) or silicon nitride (SiNx), but is not limited thereto.

The gate electrode 122 is disposed on the gate insulating layer 112. The gate electrode 122 can be formed of a conductive material, for example, copper (Cu), aluminum (Al), molybdenum (Mo), nickel (Ni), titanium (Ti), chromium (Cr), or an alloy thereof, but is not limited thereto.

An interlayer insulating layer 113 is disposed on the gate electrode 122. Contact holes for connecting the source electrode 123 and the drain electrode 124 to the active layer 121 are formed in the interlayer insulating layer 113 and the gate insulating layer 112. The interlayer insulating layer 113 can be composed of a single layer or multilayers of silicon oxide (SiOx) or silicon nitride (SiNx), but is not limited thereto.

The source electrode 123 and the drain electrode 124 are disposed on the interlayer insulating layer 113. The source electrode 123 and the drain electrode 124 can be spaced apart from each other and electrically connected to the active layer 121. The source electrode 123 and the drain electrode 124 can be formed of a conductive material, for example, copper (Cu), aluminum (Al), molybdenum (Mo), nickel (Ni), titanium (Ti), chromium (Cr), or an alloy thereof, but is not limited thereto.

The common electrode 130 is disposed on the interlayer insulating layer 113. The common electrode 130 can be an electrode that is disposed not only in the second sub-pixel SP2, but also in the first sub-pixel SP1 and the third sub-pixel SP3 in common. The common electrode 130 can be electrically connected to a common voltage line and receive a common voltage. The common electrode 130 can be formed of copper (Cu), aluminum (Al), molybdenum (Mo), nickel (Ni), titanium (Ti), chromium (Cr) or an alloy thereof, but is not limited thereto.

A passivation layer 114 is disposed on the source electrode 123, the drain electrode 124, and the common electrode 130. The passivation layer 114 can protect the source electrode 123, the drain electrode 124, and the common electrode 130. The passivation layer 114 can be composed of a single layer or multilayers of silicon oxide (SiOx) or silicon nitride (SiNx), but is not limited thereto.

A planarization layer 115 is disposed on the passivation layer 114. The planarization layer 115 is an insulating layer that planarizes an upper portion of the first substrate 110. Contact holes for connecting the drain electrode 124 and the common electrode 130 to the first pad 141 and the common pad 142, respectively, are formed in the planarization layer 115 and the passivation layer 114. The planarization layer 115 can be composed of an organic material, for example, a single layer or multilayers of polyimide or photo acryl, but is not limited thereto.

The first pad 141 and the common pad 142 are disposed on the planarization layer 115. The first pad 141 can be electrically connected to the drain electrode 124 of the transistor 120, but is not limited thereto, and can be connected to the source electrode 123. The common pad 142 can be electrically connected to the common electrode 130. The first pad 141 and the common pad 142 can be formed of molybdenum (Mo), aluminum (Al), chromium (Cr), gold (Au), silver (Ag), titanium (Ti), nickel (Ni), neodymium (Nd), and copper (Cu) or an alloy thereof, but is not limited thereto.

The second substrate 150 is disposed to face the first substrate 110. The second substrate 150 is a support member for supporting other components of the display device 100, and can be formed of an insulating material. For example, the second substrate 150 can be formed of glass or resin. In addition, the second substrate 150 can be formed to include a polymer or plastic such as polyimide (PI), or can be formed of a material having flexibility.

The first electrode 161 is disposed on the second substrate 150 to correspond to the first pad 141. Specifically, based on FIG. 4, the first electrode 161 can be disposed on a lower surface of the second substrate 150 to face the first pad 141. The first electrode 161 can include the first portion 161a overlapping the first pad 141 and the second portion 161b extending from the first portion 161a. The first portion 161a can be electrically connected to the first pad 141 by the adhesive pattern 180. Accordingly, the first electrode 161 can be connected to the transistor 120 and receive a data voltage.

The second electrode 162 is disposed on the second substrate 150 to correspond to the common pad 142. Specifically, based on FIG. 4, the second electrode 162 can be disposed on the lower surface of the second substrate 150 to face the common pad 142. The second electrode 162 can include the line electrode 162a overlapping the common pad 142, the branch electrode 162b extending from the line electrode 162a, and the second protrusions 162c extending from the branch electrode 162b. The line electrode 162a can be electrically connected to the common pad 142 by the adhesive pattern 180. Accordingly, the second electrode 162 can be connected to the common electrode 130 and receive a common voltage.

The first electrode 161 and the second electrode 162 can be formed of a conductive material, for example, copper (Cu), aluminum (Al), molybdenum (Mo), nickel (Ni), titanium (Ti), chromium (Cr), or an alloy thereof, but is not limited thereto.

The light emitting nanorod 170 is disposed between the first electrode 161 and the second electrode 162. The light emitting nanorod 170 can include a first nanorod electrode 171, a first conductive semiconductor layer 172, an active layer 173, a second conductive semiconductor layer 174, and a second nanorod electrode 175. The first nanorod electrode 171 can contact the second portion 161b of the first electrode 161, and the second nanorod electrode 175 can contact the second protrusion 162c of the second electrode 162. Accordingly, a data voltage and a common voltage can be applied to the light emitting nanorod 170 so that light can be emitted from the active layer 173. Although it is illustrated that the light emitting nanorod 170 is disposed on the second substrate 150 and contacts ends of the first electrode 161 and the second electrode 162, the present disclosure is not limited thereto. For example, the first nanorod electrode 171 and the second nanorod electrode 175 of the light emitting nanorod 170 are disposed on the second portion 161b and the second protrusion 162c, respectively, and can be in contact with the first electrode 161 and the second electrode 162, respectively. A specific structure of the light emitting nanorod 170 will be described later.

The adhesive pattern 180 can electrically connect the first pad 141 and the first portion 161a of the first electrode 161. Also, the adhesive pattern 180 can electrically connect the common pad 142 and the line electrode 162a of the second electrode 162. The adhesive pattern 180 can be formed of a conductive material, for example, copper (Cu), aluminum (Al), molybdenum (Mo), nickel (Ni), titanium (Ti), chromium (Cr) or an alloy thereof, but is not limited thereto. In addition, bonding of the first pad 141 and the first portion 161a and bonding of the common pad 142 and the line electrode 162a can be performed by eutectic or anisotropic conductive film (ACF) bonding, but the present disclosure is not limited thereto.

Figure 5:
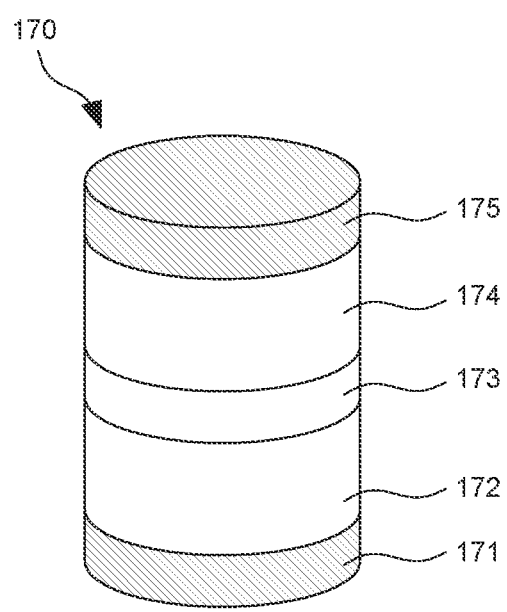
FIG. 5 is a perspective view of a light emitting nanorod of the display device according to an exemplary embodiment of the present disclosure.

FIG. 5 is a perspective view of a light emitting nanorod of the display device according to an exemplary embodiment of the present disclosure.

Referring to FIG. 5, the light emitting nanorod 170 includes the first nanorod electrode 171, the first conductive semiconductor layer 172, the active layer 173, the second conductive semiconductor layer 174, and the second nanorod electrode 175 sequentially stacked one on top of another. The light emitting nanorod 170 can be formed in a cylindrical shape, but is not limited thereto.

The first nanorod electrode 171 can supply holes to the active layer 173. The first nanorod electrode 171 can be formed of molybdenum (Mo), aluminum (Al), chromium (Cr), gold (Au), silver (Ag), titanium (Ti), nickel (Ni), neodymium (Nd), and copper (Cu) or an alloy thereof. Alternatively, the first nanorod electrode 171 can be formed of a transparent conductive material such as indium tin oxide (ITO) or indium zinc oxide (IZO), but is not limited thereto.

The first conductive semiconductor layer 172 is disposed on the first nanorod electrode 171. The first conductive semiconductor layer 172 can be a p-type semiconductor layer including a group III-V semiconductor material. Specifically, the first conductive semiconductor layer 172 can include a semiconductor material having a composition formula of $In_xAl_yGa_{1-x-y}N$ ($0 \leq x \leq 1$, $0 \leq y \leq 1$, $0 \leq x+y \leq 1$). For example, the first conductive semiconductor layer 172 can include any one of InAlGaN, GaN, AlGaN, InGaN, AlN, and InN, and can be doped with a first conductive dopant, for example, magnesium (Mg) or the like.

The active layer 173 is disposed on the first conductive semiconductor layer 172. The active layer 173 is a layer for emitting light of a specific color, and can include one of a red active layer, a green active layer, and a blue active layer. When an electric field is applied, the active layer 173 can emit light by electron-hole pair bonding. The active layer 173 can have a single or multiple quantum well structure. The active layer 173 can include a group III-V semiconductor material.

The second conductive semiconductor layer 174 is disposed on the active layer 173. The second conductive semiconductor layer 174 can be an n-type semiconductor layer including a group III-V semiconductor material. Specifically, the second conductive semiconductor layer 174 can include a semiconductor material having a composition formula of $In_xAl_yGa_{1-x-y}N$ ($0 \leq x \leq 1$, $0 \leq y \leq 1$, $0 \leq x+y \leq 1$). For example, the second conductive semiconductor layer 174 can include any one of InAlGaN, GaN, AlGaN, InGaN, AlN, and InN, and can be doped with a second conductive dopant, for example, silicon (Si), germanium (Ge), tin (Sn) or the like.

The second nanorod electrode 175 can supply electrons to the active layer 173. The second nanorod electrode 175 can be formed of molybdenum (Mo), aluminum (Al), chromium (Cr), gold (Au), silver (Ag), titanium (Ti), nickel (Ni), neodymium (Nd), and copper (Cu) or an alloy thereof. Alternatively, the second nanorod electrode 175 can be formed of a transparent conductive material such as indium tin oxide (ITO) or indium zinc oxide (IZO), but is not limited thereto.

Figure 6A:
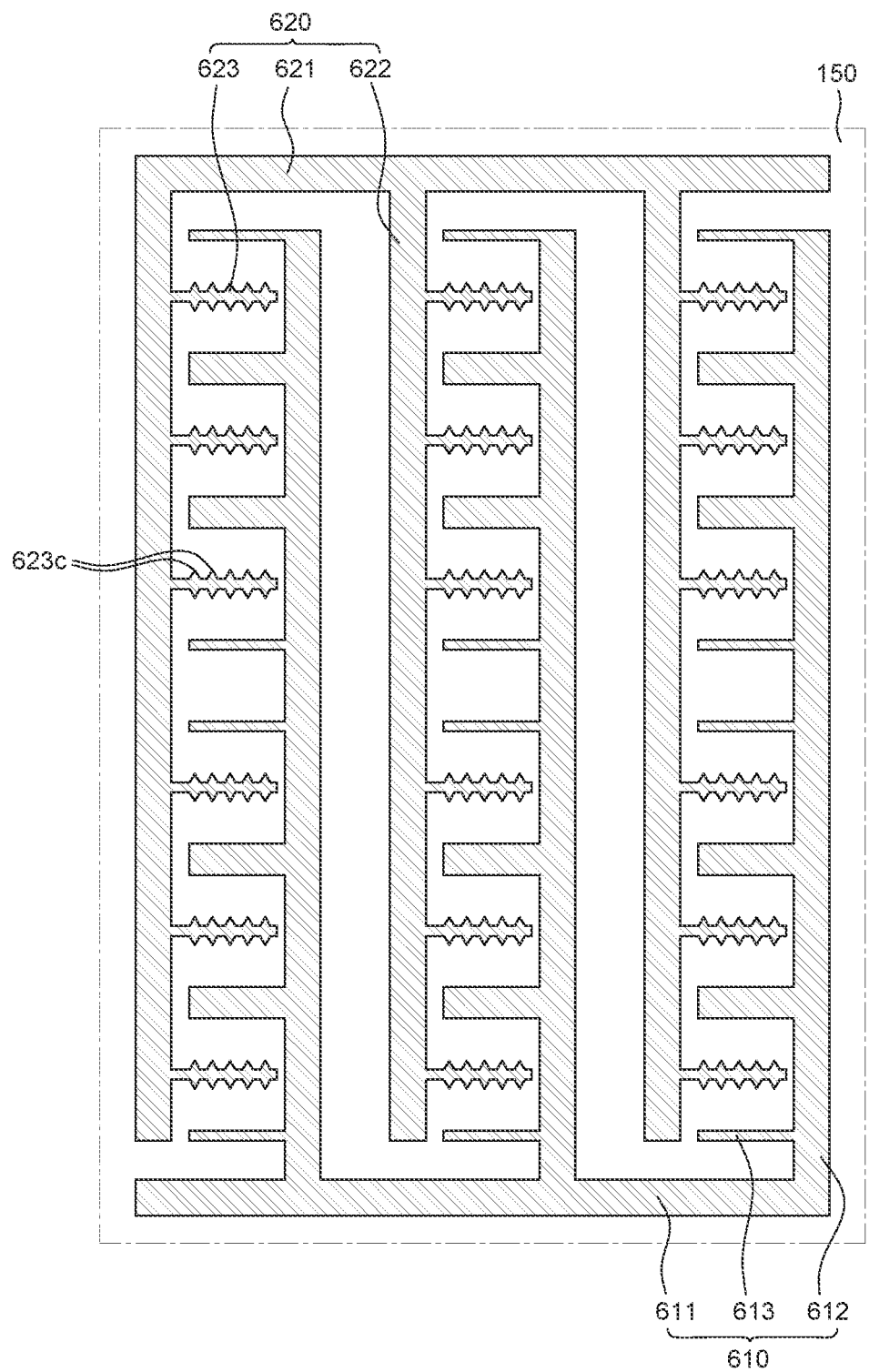
FIG. 6A to FIG. 6C are plan views for explaining a method of manufacturing a second substrate according to an exemplary embodiment of the present disclosure.
Figure 6B:
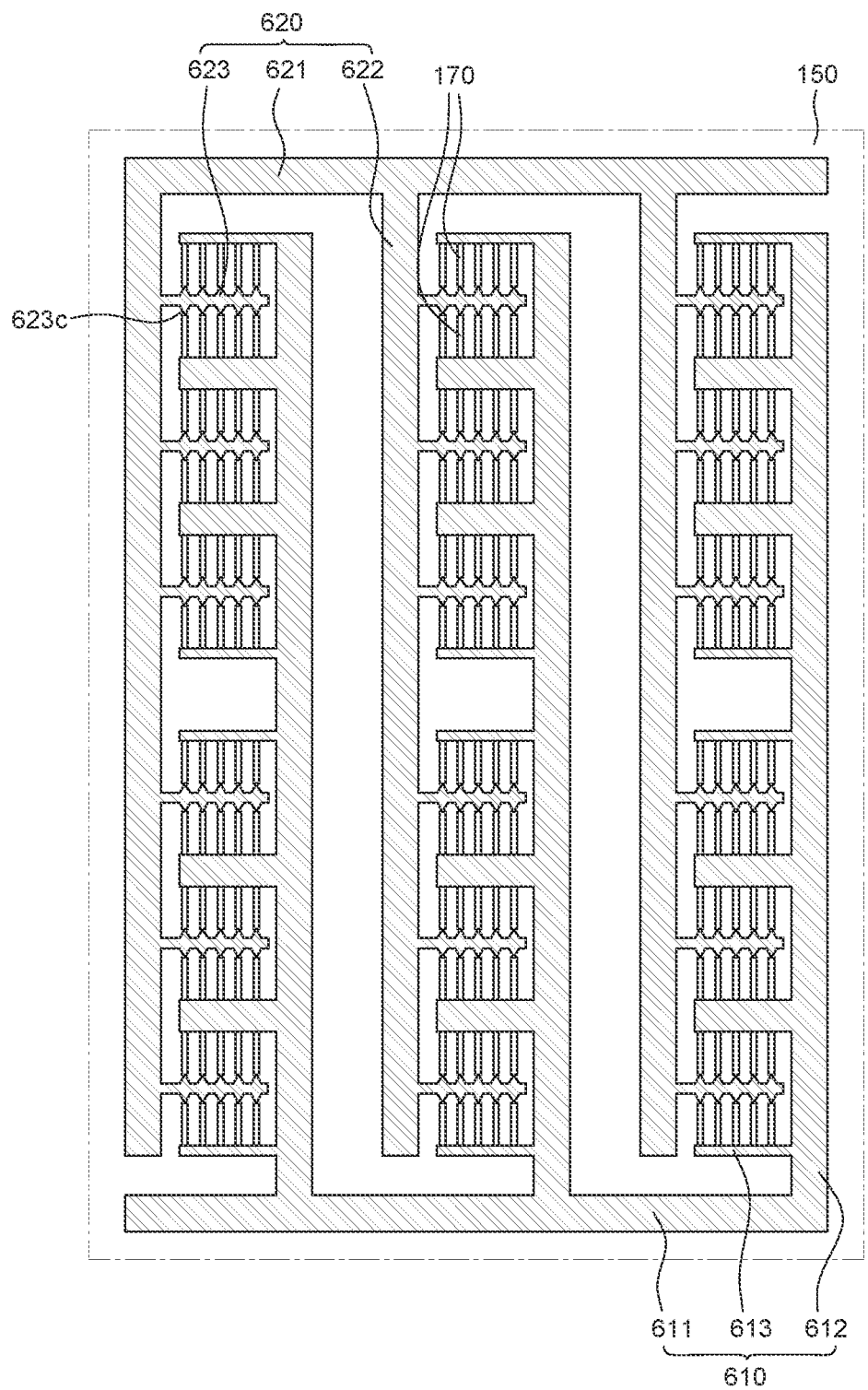
Figure 6C:
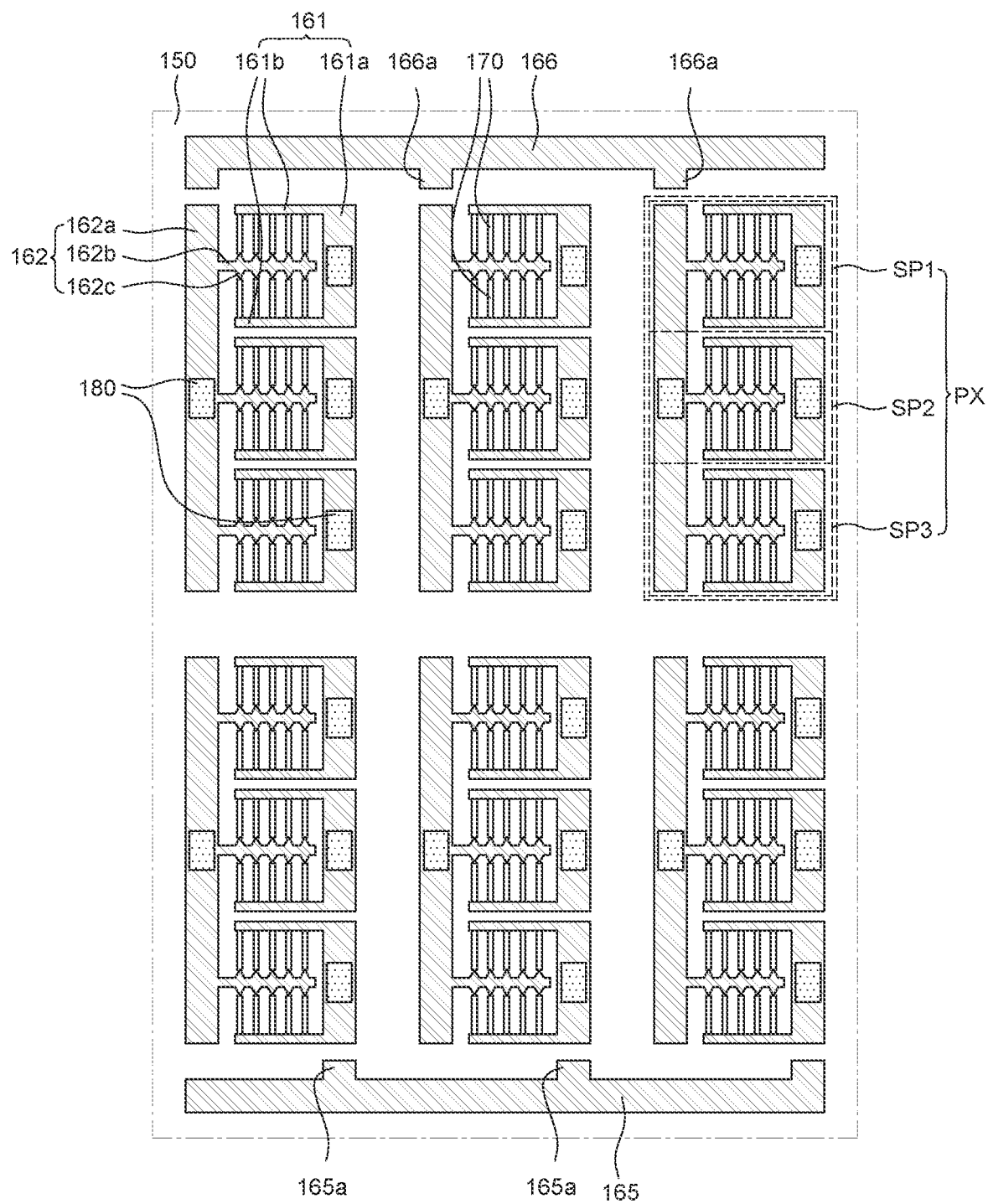

FIG. 6A to FIG. 6C are plan views for explaining a method of manufacturing a display device according to an exemplary embodiment of the present disclosure. Specifically, FIG. 6A to FIG. 6C are plan views for explaining a method of manufacturing the first electrodes 161, the second electrodes 162, the first and second dummy electrodes 165 and 166, the light emitting nanorods 170, and the adhesive patterns 180 that are disposed on the second substrate 150 of the display device 100 according to an exemplary embodiment of the present disclosure.

First, referring to FIG. 6A, a step of forming a first electrode layer 610 and a second electrode layer 620 that are spaced apart from each other is performed on the second substrate 150. The first electrode layer 610 and the second electrode layer 620 can be formed by depositing an electrode material on the second substrate 150 using a mask. The electrode material can be composed of a conductive material, for example, copper (Cu), aluminum (Al), molybdenum (Mo), nickel (Ni), titanium (Ti), chromium (Cr), or an alloy thereof, but is not limited thereto.

The first electrode layer 610 includes a dummy portion 611, first portions 612, and second portions 613. The second electrode layer 620 includes a dummy portion 621, first portions 622, and second portions 623. Shapes of the dummy portions 611 and 621, the first portions 612 and 622, and the second portions 613 and 623 are not limited to those shown in FIG. 6A to FIG. 6C, and can be variously changed according to the number and arrangement of the pixels PX.

The dummy portion 611 of the first electrode layer 610 and the dummy portion 621 of the second electrode layer 620 are disposed to be parallel to each other on the first substrate 150. The dummy portions 611 and 621 can be disposed to correspond to an outside of the plurality of pixels PX. The dummy portions 611 and 621 can be regions that are separated from the first portions 612 and 622 after self-alignment of the light emitting nanorods 170 is completed.

The first portion 612 of the first electrode layer 610 extends from the dummy portion 611 of the first electrode layer 610 toward the dummy portion 621 of the second electrode layer 620. Also, the first portion 622 of the second electrode layer 620 extends from the dummy portion 621 of the second electrode layer 620 toward the dummy portion 611 of the first electrode layer 610. The first portion 612 of the first electrode layer 610 and the first portion 622 of the second electrode layer 620 can be disposed to face each other while being parallel to each other. For example, the first portion 612 of the first electrode layer 610 and the first portion 622 of the second electrode layer 620 can be disposed to respectively correspond to one side and the other side of the pixel PX or the sub-pixels SP1, SP2, and SP3.

The second portions 613 of the first electrode layer 610 extend from the first portion 612 of the first electrode layer 610 toward the first portion 622 of the second electrode layer 620. In this case, the second portions 613 of the first electrode layer 610 include thin second portions and thick second portions. For example, the thin second portions 613 can be disposed to correspond to upper and lower sides of the pixel PX. The thick second portions 613 can be disposed to correspond to a boundary between the first sub-pixel SP1 and the second sub-pixel SP2 adjacent to each other and a boundary between the second sub-pixel SP2 and the third sub-pixel SP3 adjacent to each other. After the self-alignment of the light emitting nanorods 170 is completed, the thick second portion 613 can be separated into two parts and disposed one by one on an upper side or a lower side of the sub-pixel SP1, SP2 or SP3.

The second portions 623 of the second electrode layer 620 extend from the first portion 622 of the second electrode layer 620 toward the first portion 612 of the first electrode layer 610. The second portions 623 of the second electrode layer 620 can be disposed to be parallel to the second portions 613 of the first electrode layer 610. Also, the second portion 623 of the second electrode layer 620 can be disposed between the two adjacent second portions 613 of the first electrode layer 610. In this case, the second portion 623 of the second electrode layer 620 can be disposed to correspond to each of the sub-pixels SP1, SP2, and SP3.

The second portion 623 of the second electrode layer 620 includes protrusions 623c protruding toward the second portions 613 of the first electrode layer 610. In FIG. 6A, it is illustrated that the protrusions 623c are formed on the second portions 623 of the second electrode layer 620, but the present disclosure is not limited thereto. For example, protrusions can be formed from the second portions 613 of the first electrode layer 610 toward the second portions 623 of the second electrode layer 620.

Referring to FIG. 6B, a step of self-aligning the plurality of light emitting nanorods 170 between the first electrode layer 610 and the second electrode layer 620 is performed. The plurality of light emitting nanorods 170 include first light emitting nanorods emitting blue light, second light emitting nanorods emitting green light, and third light emitting nanorods emitting red light. The first light emitting nanorods can be disposed to correspond to the first sub-pixel SP1. The second light emitting nanorods can be disposed to correspond to the second sub-pixel SP2. The third light emitting nanorods can be disposed to correspond to the third sub-pixel SP3.

The step of self-aligning the plurality of light emitting nanorods 170 can include a step of self-aligning the first light emitting nanorods, a step of self-aligning the second light emitting nanorods, and a step of self-aligning the third light emitting nanorods.

Specifically, a photoresist is disposed on the second substrate 150 on which the first electrode layer 610 and the second electrode layer 620 are formed, and only a region corresponding to the first sub-pixel SP1 is etched. The first electrode layer 610 and the second electrode layer 620 corresponding to the first sub-pixel SP1 can be exposed in the region opened by the etching. In addition, a first light emitting nanorod solution can be injected into the open region. In this case, the first light emitting nanorod solution can be prepared by mixing the plurality of first light emitting nanorods in a solvent. The solvent can include any one of acetone, water, alcohol, and toluene, but is not limited thereto.

After the injection of the light emitting nanorod solution, a direct current (DC) is applied to the first electrode layer 610 and the second electrode layer 620. For example, a negative current can be applied to the first electrode layer 610 and a positive current can be applied to the second electrode layer 620, but the present disclosure is not limited thereto. When a direct current is applied to the first electrode layer 610 and the second electrode layer 620, the first nanorod electrodes 171 of the first light emitting nanorods can be aligned toward the first electrode layer 610 and the second nanorod electrodes 172 of the first light emitting nanorods can be aligned toward the second electrode layer 620. For example, as a direct current is applied to the first electrode layer 610 and the second electrode layer 620, the first light emitting nanorods can be easily self-aligned.

Next, the photoresist is completely removed, and the same process as in the first sub-pixel SP1 is performed on a region corresponding to the second sub-pixel SP2 and a region corresponding to the third sub-pixel SP3. From this, the light emitting nanorods 170 can be self-aligned in the plurality of sub-pixels SP1, SP2, and SP3.

In particular, the second nanorod electrode 175 of the light emitting nanorod 170 can be connected to the protrusion 623c of the second electrode layer 620. Specifically, when a direct current is applied to the second electrode layer 620, a current can be concentrated on the protrusions 623c. Accordingly, the second nanorod electrode 175 can be aligned by being drawn toward the protrusion 623c in which the current is concentrated. Accordingly, manufacture efficiency of the display device 100 can be improved by more effectively aligning the plurality of light emitting nanorods 170.

Referring to FIG. 6C, steps of separating the plurality of sub-pixels SP1, SP2, and SP3 and forming the adhesive patterns 180 are performed.

First, in order to dispose a photoresist and separate the plurality of sub-pixels SP1, SP2, and SP3, regions from which portions of the electrode layers 610 and 620 are to be removed can be opened. In addition, by removing portions of the electrode layers 610 and 620, the plurality of sub-pixels SP1, SP2, and SP3 can be separated from each other.

Specifically, the dummy portion 611 and the first portion 612 of the first electrode layer 610 are separated, a part of the first portion 612 is separated, and the thick second portion 613 can be divided into two parts. The separated dummy portion 611 can become the first dummy electrode 165, the separated first portion 612 can become the first portion 161a of the first electrode 161, and the separated second portion 613 can become the second portion 161b of the first electrode 161. On a portion of the first dummy electrode 165, the first dummy protrusion 165a remaining after being separated from the first portion 161a can be present.

Also, the dummy portion 621 and the first portion 622 of the second electrode layer 620 can be separated, and a part of the first portion 622 can be separated. The separated dummy portion 621 can become the second dummy electrode 166, the separated first portion 622 can become the line electrode 162a of the second electrode 162, the second portion 623 can become the branch electrode 162b of the second electrode 162, and the protrusion 623c can become the second protrusion 162c of the second electrode 162. On a portion of the second dummy electrode 166, the second dummy protrusion 166a remaining after being separated from the line electrode 162a can be present.

After the plurality of sub-pixels SP1, SP2, and SP3 are separated, the adhesive patterns 180 are formed. The adhesive patterns 180 can be disposed on a plurality of the first portions 161a and a plurality of the line electrodes 162a. Also, the adhesive patterns 180 can be disposed in regions corresponding to the first pad 141 and the common pad 142 of the first substrate 110.

Meanwhile, a manufacturing process of the display device 100 can be completed by bonding the second substrate 150 according to the above-described manufacturing method to the first substrate 110. The first substrate 110 and the second substrate 150 can be electrically connected to each other by the adhesive patterns 180.

In the case of a display device including general light emitting nanorods, red light emitting nanorods, green light emitting nanorods, and blue light emitting nanorods were directly individually transferred to regions corresponding to a red sub-pixel, a green sub-pixel, and a blue sub-pixel. Accordingly, there are disadvantages in that a process time and costs increase, and a decrease in yield is caused.

Accordingly, in the display device 100 according to an exemplary embodiment of the present disclosure, the first electrode layer 610 and the second electrode layer 620 for self-aligning the light emitting nanorods 170 can be disposed on the second substrate 150. For example, by injecting a solution including the light emitting nanorods 170 into the first electrode layer 610 and the second electrode layer 620 and applying a direct current thereto, the light emitting nanorods 170 can be self-aligned. In other words, the first nanorod electrodes 171 of the light emitting nanorods 170 can be aligned toward the first electrode layer 610 to which a negative current is applied, and the second nanorod electrodes 175 of the light emitting nanorods 170 can be aligned toward the second electrode layer 620 to which a positive current is applied. Accordingly, the plurality of light emitting nanorods 170 can be easily disposed in the plurality of sub-pixels SP1, SP2, and SP3.

In addition, the self-alignment of the plurality of light emitting nanorods 170 can be simultaneously performed in each of the sub-pixels SP1, SP2, and SP3. Specifically, when the first light emitting nanorods are self-aligned, a process can be proceeded by opening an entirety of regions corresponding to the first sub-pixels SP1. Accordingly, the self-alignment of the plurality of first light emitting nanorods can be simultaneously performed in all of the plurality of first sub-pixels SP1. In addition, the self-alignment of the plurality of second light emitting nanorods can be simultaneously performed in all of the plurality of second sub-pixels SP2. In addition, the self-alignment of the plurality of third light emitting nanorods can be simultaneously performed in all of the plurality of third sub-pixels SP3. In other words, a process of self-aligning the light emitting nanorods 170 can be performed once for each of the plurality of sub-pixels SP1, SP2, and SP3. Accordingly, since individual transfers of the light emitting nanorods 170 are unnecessary, the process can be simplified. Accordingly, a process time can be shortened, costs can be reduced, and a yield can be improved.

In addition, the second portion 623 of the second electrode layer 620 can include a plurality of the protrusions 623c. When a direct current is applied to the second electrode layer 620, the current can be concentrated on the plurality of protrusions 623c of the second electrode layer 620. The plurality of light emitting nanorods 170 can be aligned by being drawn to the plurality of protrusions 623c in which the current is concentrated. Accordingly, the plurality of light emitting nanorods 170 can be uniformly aligned at accurate positions. Accordingly, an alignment defect can be minimized and reliability of the display device 100 can be improved.

Figure 7:
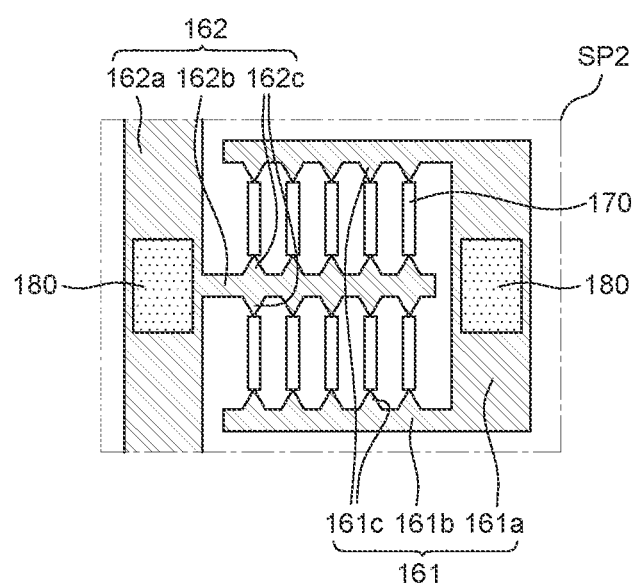
FIG. 7 to FIG. 10 are partial enlarged plan views of the second substrate according to various embodiments of the present disclosure.

FIG. 7 is a partial enlarged plan view of the second substrate according to another exemplary embodiment of the present disclosure. In FIG. 7, one sub-pixel SP2 among the plurality of sub-pixels SP1, SP2, and SP3 is illustrated for convenience of explanation. Since other configurations of the second substrate 150 of FIG. 7 are substantially the same as those of the second substrate 150 of FIG. 1 except that both a first electrode 161 and the second electrode 162 respectively include first and second protrusions 161c and 162c, a redundant description will be omitted or may be provided briefly.

Referring to FIG. 7, the first electrode 161 includes the first portion 161a, the pair of second portions 161b, and a plurality of first protrusions 161c, and the second electrode 162 includes the line electrode 162a, the branch electrode 162b, and the plurality of second protrusions 162c.

The plurality of first protrusions 161c can protrude from the pair of second portions 161b toward the branch electrode 162b. The plurality of second protrusions 162c can protrude from the branch electrode 162b toward the pair of second portions 161b. The plurality of first protrusions 161c and the plurality of second protrusions 162c can be disposed to face each other. Accordingly, the plurality of first protrusions 161c and the plurality of second protrusions 162c can be disposed to be symmetrical with each other based on an imaginary straight line that is parallel to the pair of second portions 161b or the branch electrode 162b. The plurality of first protrusions 161c can be formed to be narrower in width from the second portion 161b toward the branch electrode 162b. Also, the plurality of second protrusions 162c can be formed to be narrower in width from the branch electrode 162b toward the second portion 161b. Ends of the plurality of first and second protrusions 161c and 162c can have a pointed shape. For example, the plurality of first and second protrusions 161c and 162c can have a triangular shape, but is not limited thereto.

In the second substrate 150 of the display device according to another exemplary embodiment of the present disclosure, both the first electrode 161 and the second electrode 162 can include the plurality of protrusions. For example, the first electrode 161 can include the plurality of first protrusions 161c protruding from the pair of second portions 162b, and the second electrode 162 can include the plurality of second protrusions 162c protruding from the branch electrode 162b. In this case, the plurality of first protrusions 161c and the plurality of second protrusions 162c can be symmetrical to each other and disposed to face each other. Accordingly, the self-alignment of the plurality of light emitting nanorods 170 can be made more easily.

Specifically, when a direct current is applied to the first electrode 761 and the second electrode 162 for self-alignment of the plurality of light emitting nanorods 170, the current can be concentrated on the plurality of first protrusions 161c and the plurality of second protrusions 162c. Accordingly, the first nanorod electrodes 171 and the second nanorod electrodes 175 of the plurality of light emitting nanorods 170 can be aligned by being drawn to the plurality of first protrusions 161c and the plurality of second protrusions 162c. Accordingly, the plurality of light emitting nanorods 170 can be uniformly aligned at more accurate positions, thereby improving alignment accuracy.

Figure 8:
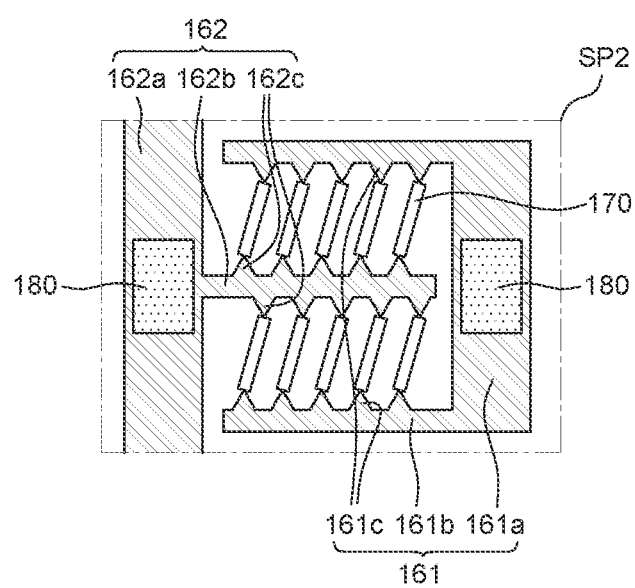

FIG. 8 is a partial enlarged plan view of the second substrate according to another exemplary embodiment of the present disclosure. In FIG. 8, one sub-pixel SP2 among the plurality of sub-pixels SP1, SP2, and SP3 is illustrated for convenience of explanation. Since other configurations of the second substrate 150 of FIG. 8 are substantially the same as those of the second substrate 150 of FIG. 7 except for arrangement structures of first and second protrusions 161c and 162c, a redundant description will be omitted or may be provided briefly.

Referring to FIG. 8, each of a plurality of first electrodes 161 includes the first portion 161a, the pair of second portions 161b, and a plurality of first protrusions 161c, and each of a plurality of second electrodes 162 includes the line electrode 162a, the plurality of branch electrodes 162b, and a plurality of second protrusions 162c.

The plurality of first protrusions 161c can protrude from the pair of second portions 161b toward the branch electrode 162b. The plurality of second protrusions 162c can protrude from the branch electrode 162b toward the pair of second portions 161b. The plurality of first protrusions 161c and the plurality of second protrusions 162c can be disposed to be offset from each other based on an imaginary straight line that is parallel to the pair of second portions 161b or the branch electrode 162b. Also, the plurality of second protrusions 162c disposed at an upper portion of the branch electrode 162b and the plurality of second protrusions 162c disposed at a lower portion of the branch electrode 162b can be disposed to be offset from each other.

One ends and the other ends of the plurality of light emitting nanorods 170 are connected to the plurality of first protrusions 161c and the plurality of second protrusions 162c, respectively. Since the plurality of first protrusions 161c and the plurality of second protrusions 162c are disposed to be offset from each other, the plurality of light emitting nanorods 170 can be arranged in an oblique line. Accordingly, during the self-alignment of the plurality of light emitting nanorods 170, alignment defects of the plurality of light emitting nanorods 170 can be reduced, and thus the reliability of the display device 100 can be improved.

Figure 9:
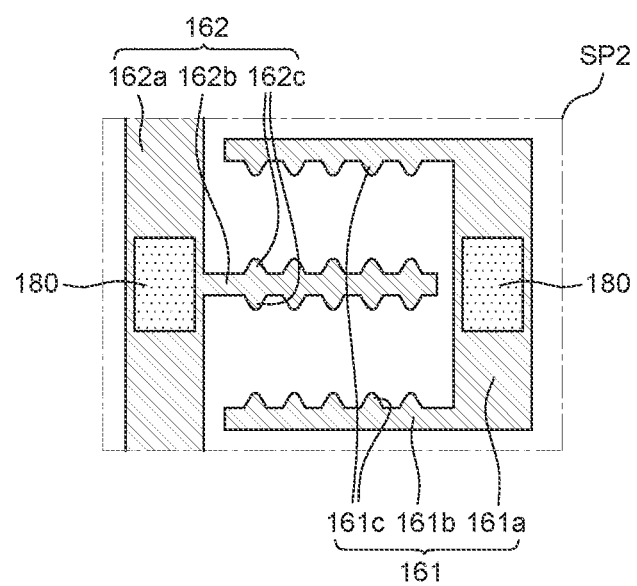

FIG. 9 is a partial enlarged plan view of the second substrate according to still another exemplary embodiment of the present disclosure. FIG. 9 shows one sub-pixel SP2 among the plurality of sub-pixels SP1, SP2, and SP3 for convenience of explanation, and an illustration of the light emitting nanorods 170 is omitted in FIG. 9. Since other configurations of the second substrate 150 of FIG. 9 are substantially the same as those of the second substrate 150 of FIG. 7 except for a shape of the first and second protrusions 161c and 162c, a redundant description will be omitted or may be provided briefly.

Referring to FIG. 9, each of a plurality of first electrodes 161 includes the first portion 161a, the pair of second portions 161b, and a plurality of first protrusions 161c, and each of a plurality of second electrodes 162 includes the line electrode 162a, the plurality of branch electrodes 162b, and a plurality of second protrusions 162c.

The plurality of first protrusions 161c can protrude from the pair of second portions 161b toward the branch electrode 162b. The plurality of second protrusions 162c can protrude from the branch electrode 162b toward the pair of second portions 161b. The plurality of first protrusions 161c and the plurality of second protrusions 162c can be symmetrical to each other and disposed to face each other. The plurality of first protrusions 161c can be formed to be narrower in width from the second portion 161b toward the branch electrode 162b. Also, the plurality of second protrusions 162c can be formed to be narrower in width from the branch electrode 162b toward the second portion 161b.

Ends of the plurality of first and second protrusions 161c and 162c can have a rounded shape. Accordingly, a contact area of the plurality of first and second protrusions 161c and 162c and the plurality of light emitting nanorods 170 can increase. Thus, resistance between the plurality of first and second protrusions 161c and 162c and the plurality of light emitting nanorods 170 can be reduced, and luminous efficiency of the display device 100 can be increased.

Figure 10:
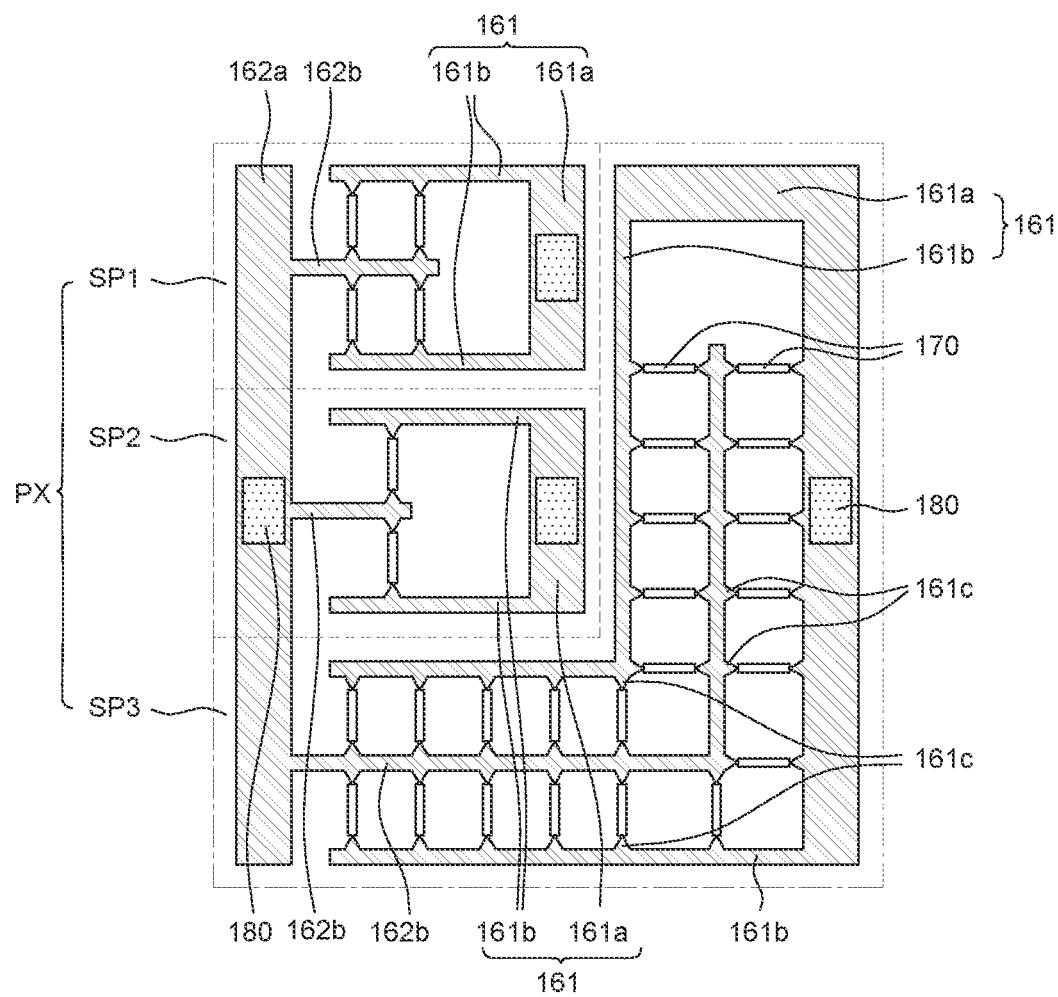

FIG. 10 is a partial enlarged plan view of the second substrate according to another exemplary embodiment of the present disclosure. In FIG. 10, one pixel PX among a plurality of pixels PX is illustrated for convenience of description. Since other configurations of a display device of FIG. 10 are substantially the same as those of the display device 100 of FIG. 1 except for arrangement structures of a first electrode 161 and a second electrode 162 in the plurality of sub-pixels SP1, SP2, and SP3, a redundant description will be omitted or may be provided briefly.

Referring to FIG. 10, the pixel PX includes a first sub-pixel SP1, a second sub-pixel SP2, and a third sub-pixel SP3. The first sub-pixel SP1, the second sub-pixel SP2, and the third sub-pixel SP3 can be a blue sub-pixel, a green sub-pixel, and a red sub-pixel, respectively. The first sub-pixel SP1, the second sub-pixel SP2, and the third sub-pixel SP3 can respectively have different areas. For example, the first sub-pixel SP1 and the second sub-pixel SP2 can have the same area, and the third sub-pixel SP3 can have an area greater than those of the first sub-pixel SP1 and the second sub-pixel SP2.

The second substrate 150 includes the first electrode 161, the second electrode 162, the plurality of light emitting nanorods 170, and the plurality of adhesive patterns 180. The first electrode 161 and the second electrode 162 can be disposed in different structures in the plurality of sub-pixels SP1, SP2, and SP3. In addition, the number of light emitting nanorods 170 disposed in each of the sub-pixels SP1, SP2, and SP3 can be different.

The first electrode 161 disposed in each of the plurality of sub-pixels includes a first portion 161a, a pair of second portions 161b, and a plurality of first protrusions 161c.

In the first sub-pixel SP1, the first portion 161a can overlap the first pad 141 of the first substrate 110 and can be disposed on a lateral portion of the first sub-pixel SP1. The pair of second portions 161b can extend from one end and the other end of the first portion 161a. The pair of second portions 161b can be disposed to be parallel to each other. The plurality of first protrusions 161c can protrude from the pair of second portions 161b toward a branch electrode 162b of the second electrode to be described later.

In the second sub-pixel SP2, the first portion 161a can overlap the first pad 141 of the first substrate 110 and can be disposed on a lateral portion of the second sub-pixel SP2. The pair of second portions 161b can extend from one end and the other end of the first portion 161a. The pair of second portions 161b can be disposed to be parallel to each other. The plurality of first protrusions 161c can protrude from the pair of second portions 161b toward a branch electrode 162b of the second electrode to be described later.

In the third sub-pixel SP3, the first portion 161a can overlap the first pad 141 of the first substrate 110 and can have a shape in which it is bent along a periphery of the third sub-pixel SP3 at a lateral portion of the third sub-pixel SP3. The pair of second portions 161b can extend from one end and the other end of the first portion 161a. In this case, an upper second portion of the pair of second portions 161b can have a bent shape, and a lower second portion thereof can have a straight shape. For example, the first portion 161a and the pair of second portions 161b of the first electrode 161 disposed in the third sub-pixel SP3 can be disposed along a periphery of a region in the third sub-pixel SP3 where a line electrode 162a of the second electrode to be described later is not disposed. The plurality of first protrusions 161c can protrude from the pair of second portions 161b toward a branch electrode 162b of the second electrode to be described later.

The second electrode 162 includes the line electrode 162a, the branch electrodes 162b, and a plurality of second protrusions 162c. The line electrode 162a can be disposed in the first sub-pixel SP1, the second sub-pixel SP2, and the third sub-pixel SP3 in common. The line electrode 162a can overlap the common pad 142 of the first substrate 110 and can be disposed on lateral portions of the first sub-pixel SP1, the second sub-pixel SP2 and the third sub-pixel SP3 in common. The branch electrodes can extend from the line electrode 162a toward the first electrode 161 in the plurality of respective sub-pixels SP1, SP2, and SP3. The branch electrodes 162b can include a branch electrode disposed in the first sub-pixel SP1, a branch electrode disposed in the second sub-pixel SP2, and a branch electrode disposed in a third sub-pixel SP3. The branch electrodes 162b can be disposed between the pairs of second portions 161b in the respective sub-pixels SP1, SP2, and SP3. The plurality of second protrusions 162c can protrude from the branch electrodes 162b toward the pairs of second portions 161b.

The plurality of first and second protrusions 161c and 162c can be formed in different numbers in each of the sub-pixels SP1, SP2, and SP3. For example, the numbers of the plurality of first and second protrusions 161c and 162c can decrease in the order of the third sub-pixel SP3, the first sub-pixel SP1, and the second sub-pixel SP2. Since the numbers of the plurality of first and second protrusions 161c and 162c are different in each of the sub-pixels SP1, SP2, and SP3, the number of the plurality of light emitting nanorods 170 connected thereto can also be different in each of the sub-pixels SP1, SP2, and SP3. For example, the number of the plurality of light emitting nanorods 170 can decrease in the order of the third sub-pixel SP3, the first sub-pixel SP1, and the second sub-pixel SP2.

Specifically, Table 1 shows needed quantities according to efficiency of the light emitting nanorods disposed in the respective sub-pixels SP1, SP2, and SP3 of the pixel PX.

TABLE 1

| | Panel Required Luminance (nit) | Light Emitting Nanorod Efficiency (Cd/A) | Light Emitting Nanorod Required Current (uA) | SP1/ SP2/ SP3 Luminance Ratio | Light Emitting Nanorod Required Quantity Ratio | Required Current Ratio |
|---|---|---|---|---|---|---|
| First sub-pixel SP1 | 16.2 | 4.7 | 0.49 | 1 | 2 | 1 |
| Second sub-pixel SP2 | 218.3 | 110 | 0.28 | 13 | 1 | 0.6 |
| Third sub-pixel SP3 | 68.1 | 3.3 | 2.93 | 4 | 10 | 6.0 |

Referring to Table 1, it could be confirmed that the efficiency of the light emitting nanorods is good in the order of the light emitting nanorods of the third sub-pixel SP3, the light emitting nanorods of the first sub-pixel SP1, and the light emitting nanorods of the second sub-pixel SP2. In addition, luminance and current required for each of the sub-pixels SP1, SP2, and SP3 can be entirely different. Accordingly, it could be confirmed that a ratio of the light emitting nanorods of the first sub-pixel SP1, the light emitting nanorods of the second sub-pixel SP2, and the light emitting nanorods of the third sub-pixel SP3 is appropriate when it is 2:1:10.

In the second substrate 150 according to another exemplary embodiment of the present disclosure, the number of light emitting nanorods 170 can be configured differently in each of the sub-pixels SP1, SP2, and SP3 according to the efficiency of the light emitting nanorods 170 disposed in each of the sub-pixels SP1, SP2, and SP3. For example, since luminous efficiency of the light emitting nanorods of the third sub-pixel SP3 is the lowest, a size of the third sub-pixel SP3 in the pixel PX, the numbers of the plurality of first and second protrusions 161c and 162c, and the number of the plurality of light emitting nanorods 170 can be more increased compared to the other sub-pixels SP1 and SP2. In addition, since luminous efficiency of the light emitting nanorods of the second sub-pixel SP2 is the best, the numbers of the plurality of first and second protrusions 161c and 162c of the second sub-pixel SP2 in the pixel PX and the number of the plurality of light emitting nanorods 170 can be more increased compared to the other sub-pixels SP1 and SP3.

For example, the numbers of the plurality of first and second protrusions 161C and 162c and the number of the plurality of light emitting nanorods 170 can be adjusted so that the efficiency of each of the sub-pixels SP1, SP2, and SP3 is uniform in one pixel PX. Accordingly, the efficiency and quality of the display device 100 can be improved.

The exemplary embodiments of the present disclosure can also be described as follows:

According to an aspect of the present disclosure, a display device having a plurality of pixels each of which includes a plurality of sub-pixels, includes a first substrate; a plurality of first pads disposed on the first substrate in the plurality of sub-pixels; a common pad disposed on the first substrate and shared by the plurality of sub-pixels; a second substrate disposed to face the first substrate; a plurality of first electrodes disposed on the second substrate and connected to the plurality of first pads; a second electrode disposed on the second substrate and connected to the common pad; and a plurality of light emitting nanorods having one ends and the other ends respectively connected to the plurality of first electrodes and the second electrode. The plurality of first electrodes and/or the second electrode includes a plurality of protrusions connected to the plurality of light emitting nanorods.

Each of the plurality of first electrodes can include a first portion and a pair of second portions extending from one end and the other end of the first portion. The second electrode can include a line electrode and a plurality of branch electrodes extending from the line electrode toward the plurality of first electrodes. Each of the plurality of branch electrodes can be disposed between the pair of second portions.

The plurality of first electrodes can include the plurality of protrusions. The plurality of protrusions can protrude from the pair of second portions toward the plurality of branch electrodes. The plurality of protrusions can be formed to be narrower in width from the pair of second portions toward the plurality of branch electrodes.

The second electrode can include the plurality of protrusions. The plurality of protrusions can protrude from the plurality of branch electrodes toward the pair of second portions. The plurality of protrusions can be formed to be narrower in width from the plurality of branch electrodes toward the pair of second portions The plurality of protrusions can include a plurality of first protrusions protruding from the pair of second portions toward the plurality of branch electrodes; and a plurality of second protrusions protruding from the plurality of branch electrodes toward the pair of second portions.

The plurality of first protrusions and the plurality of second protrusions can be disposed to be symmetrical to each other with respect to an imaginary straight line that is parallel to the plurality of branch electrodes or the pair of second portions.

The plurality of first protrusions and the plurality of second protrusions can be disposed to be offset from each other based on an imaginary straight line that is parallel to the plurality of branch electrodes or the pair of second portions.

Ends of the plurality of protrusions connected to the plurality of light emitting nanorods can have a pointed shape or a rounded shape.

The plurality of sub-pixels can include a blue sub-pixel, a green sub-pixel, and a red sub-pixel. The number of the plurality of light emitting nanorods disposed in the red sub-pixel can be greater than the numbers of the plurality of light emitting nanorods disposed in the blue sub-pixel and the green sub-pixel.

The display device can further include a plurality of dummy electrodes disposed on the second substrate to correspond to an outside of the plurality of pixels and spaced apart from the plurality of first electrodes and the second electrode.

According to another aspect of the present disclosure, a display device having a plurality of pixels each of which includes a plurality of sub-pixels, includes a first substrate and a second substrate facing each other; a plurality of first pads disposed on the first substrate in the plurality of sub-pixels; a common pad disposed on the first substrate and shared by the plurality of sub-pixels; a plurality of first electrodes disposed on the second substrate in the plurality of sub-pixels; a second electrode disposed on the second substrate and shared by the plurality of sub-pixels; a plurality of light emitting nanorods disposed on the second substrate in the plurality of sub-pixels and in contact with the plurality of first electrodes and the second electrode; and adhesive patterns connecting the plurality of first pads and the plurality of first electrodes and connecting the common pad and the second electrode. The plurality of first electrodes and/or the second electrode includes a plurality of protrusions connected to the plurality of light emitting nanorods.

Each of the plurality of first electrodes can include a first portion and a pair of second portions extending from both ends of the first portion. The second electrode can include a line electrode and a plurality of branch electrodes extending from the line electrode toward the plurality of first electrodes. The plurality of branch electrodes can be surrounded by the plurality of first electrodes.

The plurality of protrusions can include a plurality of first protrusions protruding from the pair of second portions toward the plurality of branch electrodes; and a plurality of second protrusions protruding from the plurality of branch electrodes toward the pair of second portions.

The plurality of sub-pixels can include a blue sub-pixel, a green sub-pixel, and a red sub-pixel. The number of the plurality of light emitting nanorods disposed in the red sub-pixel can be greater than the numbers of the plurality of light emitting nanorods disposed in the blue sub-pixel and the green sub-pixel.

According to yet another aspect of the present disclosure, a method of manufacturing a display device having a plurality of pixels each of which includes a plurality of sub-pixels, includes preparing a first substrate on which a plurality of first pads disposed in the plurality of sub-pixels and a common pad shared by the plurality of sub-pixels are disposed; forming a first electrode layer and a second electrode layer spaced apart from each other on a second substrate; self-aligning a plurality of light emitting nanorods by applying a direct current to the first electrode layer and the second electrode layer; separating the first electrode layer and the second electrode layer into a plurality of first electrodes and a second electrode, respectively, corresponding to the plurality of sub-pixels; and bonding the first substrate and the second substrate by connecting the plurality of first pads and the plurality of first electrodes and connecting the common pad and the second electrode. The plurality of light emitting nanorods are connected to a plurality of protrusions of the first electrode layer and/or the second electrode layer and are self-aligned.

The plurality of sub-pixels can include a first sub-pixel, a second sub-pixel, and a third sub-pixel. The plurality of light emitting nanorods can include first light emitting nanorods, second light emitting nanorods, and third light emitting nanorods. The self-aligning of the plurality of light emitting nanorods can include self-aligning the first light emitting nanorods by injecting a first light emitting nanorod solution into an opening region on the first electrode layer and the second electrode layer corresponding to the first sub-pixel; self-aligning the second light emitting nanorods by injecting a second light emitting nanorod solution into an opening region on the first electrode layer and the second electrode layer corresponding to the second sub-pixel; and self-aligning the third light emitting nanorods by injecting a third light emitting nanorod solution into an opening region on the first electrode layer and the second electrode layer corresponding to the third sub-pixel. The first light emitting nanorod solution, the second light emitting nanorod solution and the third light emitting nanorod solution can be prepared by respectively mixing the plurality of first light emitting nanorods, the plurality of second light emitting nanorods and the plurality of third light emitting nanorods in a solvent, and the solvent can include any one of acetone, water, alcohol, and toluene.

Each of the plurality of first electrodes can include a first portion and a pair of second portions respectively extending from one side and the other side of the first portion. The second electrode can include a line electrode and a plurality of branch electrodes extending from the line electrode toward the plurality of first electrodes. Each of the plurality of branch electrodes can be disposed between the pair of second portions.

The plurality of protrusions include a plurality of first protrusions protruding from the pair of second portions toward the plurality of branch electrodes; and a plurality of second protrusions protruding from the plurality of branch electrodes toward the pair of second portions.

The plurality of sub-pixels can include a blue sub-pixel, a green sub-pixel, and a red sub-pixel. The number of the plurality of light emitting nanorods disposed in the red sub-pixel can be greater than the numbers of the plurality of light emitting nanorods disposed in the blue sub-pixel and the green sub-pixel.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device having a plurality of pixels each including a plurality of sub-pixels, the display device comprising:
    a first substrate;
    a plurality of first pads disposed on the first substrate in the plurality of sub-pixels;
    a common pad disposed on the first substrate and shared by the plurality of sub-pixels;
    a second substrate disposed to face the first substrate;
    a plurality of first electrodes disposed under the second substrate and connected to the plurality of first pads;
    a second electrode disposed under the second substrate and connected to the common pad; and
    a plurality of light emitting nanorods having one ends and the other ends respectively and directly connected to the plurality of first electrodes and the second electrode,
    wherein the plurality of first electrodes and/or the second electrode includes a plurality of protrusions directly connected to the plurality of light emitting nanorods, and
    wherein uppermost surfaces of the plurality of first electrodes, the second electrode, and the plurality of light emitting nanorods are coplanar in a cross-section view of the display device.

2. The display device of claim 1, wherein each of the plurality of first electrodes includes a first portion and a pair of second portions extending from one end and the other end of the first portion,
    wherein the second electrode includes a line electrode and a plurality of branch electrodes extending from the line electrode toward the plurality of first electrodes, and
    wherein each of the plurality of branch electrodes is disposed between the pair of second portions.

3. The display device of claim 2, wherein the plurality of first electrodes include the plurality of protrusions, and
    wherein the plurality of protrusions protrude from the pair of second portions toward the plurality of branch electrodes.

4. The display device of claim 3, wherein the plurality of protrusions are formed to be narrower in width from the pair of second portions toward the plurality of branch electrodes.

5. The display device of claim 2, wherein the second electrode includes the plurality of protrusions, and
    wherein the plurality of protrusions protrude from the plurality of branch electrodes toward the pair of second portions.

6. The display device of claim 5, wherein the plurality of protrusions are formed to be narrower in width from the plurality of branch electrodes toward the pair of second portions.

7. The display device of claim 2, wherein the plurality of protrusions include:
    a plurality of first protrusions protruding from the pair of second portions toward the plurality of branch electrodes; and
    a plurality of second protrusions protruding from the plurality of branch electrodes toward the pair of second portions.

8. The display device of claim 7, wherein the plurality of first protrusions and the plurality of second protrusions are disposed to be symmetrical to each other with respect to an imaginary straight line that is parallel to the plurality of branch electrodes or the pair of second portions.

9. The display device of claim 7, wherein the plurality of first protrusions and the plurality of second protrusions are disposed to be offset from each other based on an imaginary straight line that is parallel to the plurality of branch electrodes or the pair of second portions.

10. The display device of claim 1, wherein ends of the plurality of protrusions directly connected to the plurality of light emitting nanorods have a pointed shape or a rounded shape.

11. The display device of claim 1, wherein the plurality of sub-pixels include a blue sub-pixel, a green sub-pixel, and a red sub-pixel, and
wherein the number of the plurality of light emitting nanorods disposed in the red sub-pixel is greater than the numbers of the plurality of light emitting nanorods disposed in the blue sub-pixel and the green sub-pixel.

12. The display device of claim 1, further comprising:
a plurality of dummy electrodes disposed under the second substrate to correspond to an outside of the plurality of pixels and spaced apart from the plurality of first electrodes and the second electrode.

13. The display device of claim 1, wherein the plurality of protrusions have a shape that becomes narrower in going from the plurality of first electrodes and/or the second electrode towards the plurality of light emitting nanorods, respectively.

14. The display device of claim 1, wherein the plurality of protrusions have a triangular shape having vertices that contact the plurality of light emitting nanorods, respectively.

15. A display device having a plurality of pixels each including a plurality of sub-pixels, the display device comprising:
a first substrate and a second substrate facing each other;
a plurality of first pads disposed on the first substrate in the plurality of sub-pixels;
a common pad disposed on the first substrate and shared by the plurality of sub-pixels;
a plurality of first electrodes disposed under the second substrate in the plurality of sub-pixels;
a second electrode disposed under the second substrate and shared by the plurality of sub-pixels;
a plurality of light emitting nanorods disposed under the second substrate in the plurality of sub-pixels and in contact with the plurality of first electrodes and the second electrode; and
a plurality of adhesive patterns connecting the plurality of first pads and the plurality of first electrodes and connecting the common pad and the second electrode,
wherein the plurality of first electrodes and/or the second electrode includes a plurality of protrusions directly connected to the plurality of light emitting nanorods, and
wherein uppermost surfaces of the plurality of first electrodes, the second electrode, and the plurality of light emitting nanorods are coplanar in a cross-section view of the display device.

16. The display device of claim 15, wherein each of the plurality of first electrodes include a first portion and a pair of second portions extending from both ends of the first portion,
wherein the second electrode includes a line electrode and a plurality of branch electrodes extending from the line electrode toward the plurality of first electrodes, and
wherein the plurality of branch electrodes are surrounded by the plurality of first electrodes.

17. The display device of claim 16, wherein the plurality of protrusions include:
a plurality of first protrusions protruding from the pair of second portions toward the plurality of branch electrodes; and
a plurality of second protrusions protruding from the plurality of branch electrodes toward the pair of second portions.

18. The display device of claim 15, wherein the plurality of sub-pixels include a blue sub-pixel, a green sub-pixel, and a red sub-pixel, and
wherein the number of the plurality of light emitting nanorods disposed in the red sub-pixel is greater than the numbers of the plurality of light emitting nanorods disposed in the blue sub-pixel and the green sub-pixel.

19. The display device of claim 15, wherein the plurality of protrusions have a shape that becomes narrower in going from the plurality of first electrodes and/or the second electrode towards the plurality of light emitting nanorods, respectively.

20. The display device of claim 15, wherein the plurality of protrusions have a triangular shape having vertices that contact the plurality of light emitting nanorods, respectively.

* * * * *